United States Patent [19]

Inaike et al.

[11] Patent Number: 4,508,766

[45] Date of Patent: Apr. 2, 1985

[54] PROCESS FOR PRODUCING AROMATIC IMIDE POLYMER LAMINATE MATERIAL

[75] Inventors: Toshihiro Inaike, Chiba; Katsuhiko Ushimi, Ichihara; Shuji Yamamoto, Chiba; Toshihiro Inoue, Ichihara, all of Japan

[73] Assignee: UBE Industries, Ltd., Chiba, Japan

[21] Appl. No.: 487,140

[22] Filed: Apr. 21, 1983

[30] Foreign Application Priority Data

Apr. 30, 1982 [JP] Japan ................... 57-71546

[51] Int. Cl.³ .............................................. B05D 3/02
[52] U.S. Cl. .................... 427/388.2; 427/96; 428/473.5
[58] Field of Search ............... 427/388.2, 96; 428/473.5

[56] References Cited

U.S. PATENT DOCUMENTS 4,411,952 10/1983 Sasaki et al. ................. 428/473.5 X

*Primary Examiner*—Thurman K. Page
*Attorney, Agent, or Firm*—Burgess, Ryan & Wayne

[57] ABSTRACT

An aromatic imide polymer laminate material usable as a flexible circuit board substrate is produced by the process comprising coating a surface of a metallic foil with a solution of an aromatic imide polymer comprising at least 90 molar % of recurring unit of the formula (I):

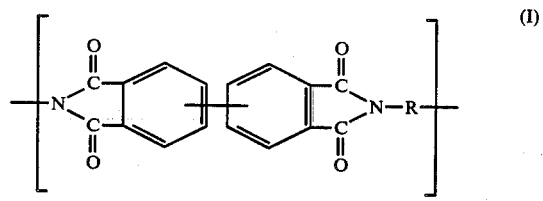

wherein R is a symmetrical bivalent aromatic radical having no substituent, and dissolved in a solvent consisting essentially of at least one phenolic compound; and heat drying the resultant solution layer to form an aromatic imide polymer solid layer firmly bonded directly to the metallic foil.

14 Claims, No Drawings

PROCESS FOR PRODUCING AROMATIC IMIDE POLYMER LAMINATE MATERIAL

BACKGROUND OF THE INVENTION

1. Field of the Invention

The present invention relates to a process for producing an aromatic imide polymer laminate material. More particularly, the present invention relates to a process for producing an aromatic imide polymer layer-metallic foil laminate material having excellent heat resistance, electric properties, and mechanical properties and, therefore, useful as a flexible circuit board substrate.

2. Description of the Prior Art

A "flexible circuit board substrate" is a flexible substrate for a printed circuit board. It is useful for producing simplified and/or highly dense printed circuit boards.

A typical, conventional flexible circuit board substrate is a composite material composed of copper foil and aromatic polyimide film bonded with the copper foil by a bonding material. This type of substrate is called a "polyimide-laminated copper substrate".

In a polyimide-laminated copper substrate, the polyimide film is bonded with the copper foil by a bonding material layer having a thickness of 10 to 30 microns. That is, the polyimide-laminated copper substrate is a three-layer laminate. Accordingly, the heat-resistance, electric properties, chemical resistance, and mechanical properties required of the polyimide-laminated copper substrate are determined mainly by the bonding material, not by the polyimide film. That is, the inherent excellent properties and advantages of the polyimide film are not fully exhibited in a conventional polyimide-laminated copper substrate due to the bonding material layer.

Under the above-mentioned circumstances, various attempts have been made to provide a new process for producing a flexible circuit board substrate without using bonding material. For example, U.S. Pat. No. 3,179,634 discloses a process wherein a solution of an aromatic polyamic acid, i.e., an aromatic polyamide acid which is a precursory compound of the corresponding aromatic polyimide, is directly coated on a surface of a copper foil and the polyamic acid solution layer is heated so as to imide-cyclize the polyamic acid into the corresponding polyimide, whereby a composite laminate composed of an aromatic polyimide coating layer bonded directly to a copper foil is obtained.

In the above-mentioned process, it was found that since the condensation conversion of the polyamide acid into the corresponding polyimide included a dehydration reaction, it results in reduction of the volume of the coating layer. This shrinkage of the coating layer causes significant bending (curling) of the resultant composite substrate. A curled substrate is useless as a flexible circuit board substrate. Therefore, the above-mentioned process is not satisfactory for the production of actual circuit board substrates.

In an approach for eliminating the above-mentioned disadvantages, Japanese Unexamined Patent Publication (Kokai) No. 49-129,862 discloses a process wherein a solution of a partially cyclized polyimideamide acid prepared by the reaction of a polyamide acid, which has been produced from pyromellitic dianhydride, with diphenylether-4,4'-diisocyanate is directly coated on a surface of a conductive metallic foil, such as copper foil, and the solution layer is heated so as to provide a completely cyclized polyimideamide layer. Compared with the process of the above-mentioned U.S. Patent this process is slightly more effective for decreasing the degree of curling of the resultant composite substrate. However, the resultant composite substrate is still curled and; therefore, is still unsatisfactory.

SUMMARY OF THE INVENTION

An object of the present invention is to provide a process for producing an aromatic imide polymer laminate material usable as a flexible circuit board substrate.

Another object of the present invention is to provide a process for producing an aromatic imide polymer laminate material substantially without forming curls thereon.

A still object of the present invention is to provide a process for producing an aromatic imide polymer laminate material having excellent heat resistance, alkali resistance, and resistances to flex-cracking and mechanical impact.

The above-mentioned objects can be attained by the process of the present invention, comprising coating a surface of a metallic foil with a solution of at least one aromatic imide polymer comprising at least 90 molar% of at least one type of recurring unit of the formula (I):

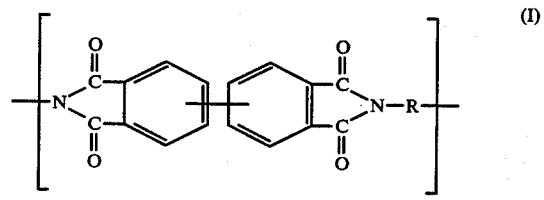

wherein R represents a symmetrical bivalent aromatic radical having no substituent and dissolved in solvent consisting essentially of at least one phenolic compound; and heat evaporating the solvent from the aromatic imide polymer solution layer to form an aromatic imide polymer solid layer firmly bonded directly to the metallic foil surface.

According to the process of the present invention, the resultant laminate material is completely free from a bonding material layer and has a decreased curls and, exhibits excellent heat resistance, alkali resistance, and resistances to flex-cracking and mechanical deformation and impact. It is, therefore, useful as a flexible circuit board.

DESCRIPTION OF THE PREFERRED EMBODIMENT

In the process of the present invention, a solution of at least one aromatic imide polymer dissolved in a phenolic solvent is prepared. The aromatic imide polymer comprises at least 90 molar% of at least one type of recurring unit of the formula (I):

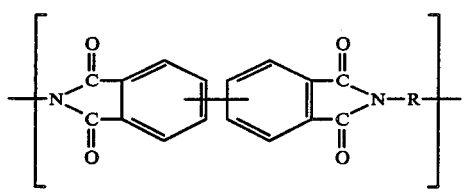

(I)

wherein R represents a symmetrical bivalent aromatic radical having no substituent.

The bivalent aromatic radical R is preferably of the symmetrical formula (II):

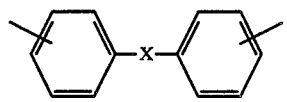

(II)

wherein X represents a radical selected from the group consisting of —O—, —CH$_2$—, —C(CH$_3$)$_2$—, —S—, —CO—, —SO$_2$— and —SO—.

The aromatic imide polymer usable for the present invention is preferably a polymerization-imidization product of a tetracarboxylic acid component comprising at least 90 molar% of at least one biphenyl tetracarboxylic acid compound with a diamine component comprising at least one symmetrical aromatic primary diamine having no substituent.

The biphenyl tetracarboxylic compound may be selected from the group consisting of 3,3',4,4'-biphenyl tetracarboxylic acid, 2,3,3',4'-biphenyl tetracarboxylic acid and their dianhydrides. Preferably, the biphenyl tetracarboxylic compound is 3,3',4,4'-biphenyl tetracarboxylic dianhydride.

The tetracarboxylic acid component may contain 10 molar% or less of one or more additional tetracarboxylic acid compounds. The additional tetracarboxylic acid compounds may be selected from the group, for example, consisting of benzophenone tetracarboxylic acid, pyromellitic acid, 2,2-bis-(3,4-dicarboxyphenyl)-propane, bis(3,4-dicarboxyphenyl)ether, and derivatives of the above-mentioned acids.

The symmetrical aromatic primary diamine is preferably of the formula (IIa):

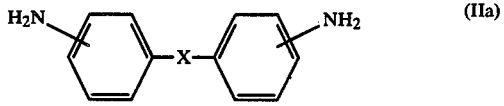

(IIa)

wherein X represents a radical selected from the group consisting of —O—, —CH$_2$—, —C(CH$_3$)$_2$—, —S—, —CO—, —SO$_2$—, and —SO—, and the —NH$_2$ radicals are positioned symmetrically to each other about the radical X.

The diamine of the formula (IIa) may be selected from the group consisting of 4,4'-diaminodiphenylether, 4,4'-diaminodiphenylthioether, 4,4'-diaminobenzophenone, 4,4'-diaminodiphenylmethane, 4,4'-diaminodiphenylsulfone, and 2,2'-bis(4-aminophenyl)propane.

In the aromatic diamine usable for the present invention, it is important that the aromatic diamine have a symmetrical chemical structure and be free from substituents. Aromatic diamines having substituents are not adequate as a diamine component of the aromatic imide polymer usable for the present invention, even if the aromatic diamine has a symmetrical chemical structure. Also, aromatic diamines having an asymmetric chemical structure are not adequate as a diamine component of the aromtic imide polymer usable for the present invention, even if the aromatic diamine is free from substituents. If the above-mentioned inadequate types of aromatic diamines are used, the resultant laminate material exhibits an unsatisfactory resistance to bending (flex-cracking) and, therefore, is useless as a flexible circuit board substrate.

The polymerization-imidization process for the aromatic imide polymer is not limited to a specific process. That is, the aromatic imide polymer can be produced by any conventional process. That is, the aromatic imide polymer can be produced by a conventional two-step process wherein a polyamic acid is produced from a tetracarboxylic acid component and a diamine component in approximately equal molar amounts and, then, is converted to the corresponding aromatic imide polymer. Alternatively, the aromatic imide polymer can be prepared in a single-step polymerization-imidization process of the aromatic tetracarboxylic acid component and the aromatic diamine component in approximately equal molar amounts.

In an example of the two-step process, an aromatic tetracarboxylic acid component and an aromatic diamine component are reacted in stoichiometrical amounts with each other in an organic polar solvent consisting of at least one member selected from N-methyl-2-pyrrolidone, N,N'-dimethyl formamide, and N,N-dimethyl acetamide; the resultant solution of the corresponding polyamic acid is mixed with an imidization accelerator, for example, an amine compound; and the mixture is heated at a temperature of from 120° C. to 250° C. to convert the polyamic acid to the corresponding imide polymer. The resultant aromatic imide polymer is collected in the form of a white or yellow precipitate.

The resultant aromatic imide polymer is dissolved preferably in a concentration of from 5% to 30% by weight in a phenolic solvent to provide a solution thereof.

In the preparation of the aromatic imide polymer solution usable for the process of the present invention, it is essential that the solvent consist essentially of at least one phenolic compound. The phenolic compound can be selected from the group consisting of phenol, cresol, nitrophenols, and halogenated phenols. Preferable phenolic compounds are halogenated phenols, for example, 3-chlorophenol, 4-chlorophenol, 3-bromophenol, 4-bromophenol, and 2-chloro-4-hydroxytoluene.

In an example of a single-step process for the preparation of the aromatic imide polymer solution, a mixture of an aromatic tetracarboxylic acid component and an aromatic diamine component in stoichiometric amounts is dissolved in a solvent consisting essentially of at least one phenolic compound. The resultant mixture solution is heated at a temperature of from 150° C. to 300° C. so as to polymerization-imidize the components in a single procedure. In this case, it is preferable that the resultant solution contain 5% to 30% by weight of an aromatic imide polymer.

The aromatic imide polymer usable for the process of the present invention preferably has a degree of imidization of 95% or more, more preferably 99% or more, a logarithmic viscosity of from 0.7 to 6.0, more preferably from 0.8 to 4, determined in the concentration of 0.5 g per 100 ml of 4-chlorophenol at a temperature of 50° C.

The term "degree of imidization" used herein refers to the proportion in percent of the real amount of imide bonds existing in a polymeric chain of an aromatic imide polymer to the theoretical amount of imide bonds which can exist in the polymeric chain. The amount of imide bonds can be determined by means of infrared absorption spectrum analysis.

The metallic foil usable for the present invention preferably consists of an electroconductive metallic material selected from, for example, the group consisting of copper, tungsten, nickel, chromium, iron, silver, aluminum, lead, tin, and alloys containing one or more of the above-mentioned metals. Preferable metallic materials are copper, aluminum, nickel, and copper alloys. When the laminate material of the present invention is used as flexible circuit board substrate, the metallic foil preferably has a thickness of from 1 to 500 microns, more preferably, from 10 to 100 microns. The surface of the metal foil to be coated with the aromatic imide polymer layer is preferably roughened by means of, for example, electrolytic etching, so as to enhance the bonding strength of the metal foil to the aromatic imide polymer layer.

The coating procedure of the metallic foil surface with the aromatic imide polymer solution can be any conventional coating method, for example, liquid spreading, roll coating, doctor blade coating, knife coating, or spraying. A preferable coating method is liquid spreading (flow coating).

Preferably, the coating procedure is carried out by extruding an aromatic imide polymer solution through an extruding slit and by spreading the extruded stream of the solution on the surface of the metallic foil. In this case, it is preferably that the coated solution layer have a uniform thickness of from 50 to 1000 microns.

The coated solution layer is subjected to a heat evaporation procedure of the solvent from the coated solution layer. The heat evaporation procedure can be carried out under ambient atmospheric pressure, reduced pressure, or elevated pressure.

In the case where the solution layer is rapidly heated so that the solvent is evaporated at a high vaporization rate before a thin solid membrane of the aromatic imide polymer is uniformly formed on the surface of the solution layer, the resultant aromatic imide polymer solid layer tends to have a roughened surface thereof. Accordingly, in the initial stage of the heat evaporation procedure, it is preferable that the evaporation be carried out gradually at a relatively low temperature, for example, from 100° C. to 180° C. and then, the vaporizing rate be gradually increased by gradually elevating the evaporation temperature upto the final evaporation temperature of from 250° C. to 400° C. so as to complete the removal of the solvent.

In another method, the heat-evaporation procedure is carried out until a thin solid membrane is formed on the surface of the solution layer and then the remaining solvent in the solution layer is replaced by a bad solvent, for example, lower alkanol or lower ketone. This method is effective for shortening the necessary time for the removal of the solvent. The resultant aromatic imide solid layer preferably has a thickness of from 10 to 150 microns.

The aromatic imide polymer laminate material produced in accordance with the process of the present invention exhibits the following advantages.

(1) Since no bonding material layer is contained, the resultant laminate material is composed of only a metallic foil and an aromatic imide polymer layer and, therefore, exhibits excellent heat resistance.

(2) The resultant laminate material exhibits an excellent resistance to curling in comparison with those produced by coating a metallic foil with an aromatic polyamic acid solution or a partially imide-cyclized polyamide solution and then by finally imidizing the polyamic acid or partially imide-cyclized polyamide on the metallic foil surface, and, therefore, is highly useful as a flexible circuit board substrate.

SPECIFIC EXAMPLES

The specific examples presented below will serve to more fully explain how the present invention can be practically used. However, it should be understood that the examples are only illustrative and in no way limit the scope of the present invention.

In the examples, the specific properties of the resultant laminate materials were determined as follows.

(A) Surface resistivity

This was measured in accordance with Japanese Industrial Standard (JIS) C-6481.

(B) Peeling strength

A specimen having a width of 10 mm and a length of 140 mm was prepared from the resultant laminate material. An aromatic imide polymer layer was peeled from the corresponding metallic foil at an angle of 180° at a peeling rate of 50 mm/min by means of an autograph.

(C) Resistance to solvent

A specimen of the resultant laminate material was immersed in trichloroethylene, acetone, or methylene chloride in accordance with JIS C-6481. After the immersion treatment, the change in appearance, including separation of the aromatic imide polymer layer from the metallic foil, was observed.

(D) Flex-cracking resistance

This resistance was determined in accordance with JIS P-8115 at a bending curvature radius of 0.8 mm under a static load of 0.5 kg.

(E) Resistance to alkali

This resistance was determined in accordance with JIS C-6481, wherein a specimen was immersed in an aqueous solution of 10% by weight of sodium hydroxide at room temperature for 30 minutes and, thereafter, the specimen was subjected to the flex-cracking resistance test described above.

(F) Resistance to soldering

This resistance was determined in accordance with JIS C-6481, wherein a specimen was immersed in a soldering bath at a temperature of 300° C. for one minute, and, then, the change in the appearance of the specimen, including blisters, was observed.

(G) Warpage (Curvature radius)

A specimen was placed in an atmosphere having a relative humidity of 60% and a temperature of 20° C. for 24 hours. When the specimen was curled, the curling curvature radius of the specimen was measured.

EXAMPLE 1

A reactor vessel was charged with a reaction mixture of 73.56 g (0.25 moles) of 3,3',4,4'-biphenyl tetracarboxylic dianhydride, 50.06 g (0.25 moles) of 4,4'-diaminodiphenyl ether, and 1,000 g of N-methyl-2-pyrrolidone. The reaction mixture was stirred at a temperature of 25° C. for 6 hours. The resultant reaction mixture was a solution of a polyamic acid having a logarithmic viscosity of 2.8. The polyamic acid solution was mixed with 50 ml of triethylamine and the mixture was gradually heated up to a temperature of 200° C. while removing a by-product consisting of water. A granular yellow precipitate was produced in the mixture. The precipitate was isolated by means of filtration, washed with methyl alcohol, and then dried at a temperature of 150° C. An aromatic imide polymer was obtained in the form of powder and exhibited a logarithmic viscosity of 1.18.

The aromatic imide polymer was dispersed in a heat-melted 4-chlorophenol and the dispersion was heated at a temperature of 180° C. to provide a homogeneous solution of 10% by weight of the aromatic imide solution. The solution was spread on a surface of a copper foil having a thickness of 35 microns at a temperature of 100° C. to form a uniform layer of the solution in an amount of 350 g/m². The solution layer was heated at a temperature of approximately 140° C. for one hour so as to remove almost all of the 4-chlorophenol, and then up to a temperature of 300° C. so as to provide a flexible copper foil laminate having an aromatic imide polymer solid layer having a thickness of aproximately 25 microns.

The properties of the resultant flexible laminate were as follows.

| | |
|---|---|
| Surface resistivity: | $2.1 \times 10^{17} \Omega$ |
| Peeling strength: | 1.33 kg/cm |
| Solvent resistance: | No change |
| Flex-cracking resistance: | 59 times |
| Alkali resistance: | 53 times |
| Soldering resistance: | No change |
| Warpage: | 9.83 cm |

EXAMPLE 2

The same aromatic imide polymer as that described in Example 1 was dissolved in 4-bromophenol at an elevated temperature of 180° C. to provide a solution of 10% by weight of the aromatic imide polymer. In the same manner as that described in Example 1, the solution was coated on to a surface of the same copper foil as that mentioned in Example 1 and a flexible copper foil laminate having an aromatic imide polymer layer having a thickness of approximately 25 microns was produced.

The properties of the resultant laminate were as follows.

| | |
|---|---|
| Surface resistivity: | $2.7 \times 10^{17} \Omega$ |
| Peeling strength: | 1.42 kg/cm |
| Solvent resistance: | No change |
| Flex-cracking resistance: | 54 times |
| Alkali resistance: | 51 times |
| Soldering resistance: | No change |
| Warpage: | 7.62 cm |

EXAMPLE 3

The same procedures as those described in Example 1 were carried out except that the aromatic imide polymer solution was prepared in a single-step reaction by heating a reaction mixture of 73.56 g (0.25 moles) of 3,3',4,4'-biphenyl tetracarboxylic dianhydride, 50.06 g (0.25 moles) of 4,4'-diaminodiphenyl ether, and 1146 g of 4-chlorophenol up to 160° C. over one hour and at 160° C. for one hour, while being stirred. The resultant aromatic imide polymer exhibited a logarithmic viscosity of 2.28.

The resultant flexible laminate had the following properties.

| | |
|---|---|
| Surface resistivity: | $4.7 \times 10^{17} \Omega$ |
| Peeling strength: | 1.74 kg/cm |
| Solvent resistance: | No change |
| Flex-cracking resistance: | 63 times |
| Alkali-resistance: | 58 times |
| Soldering resistance: | No change |
| Warpage: | 9.33 cm |

EXAMPLE 4

The same procedures as those described in Example 3 were carried out except that 4,4'-diaminodiphenyl ether was replaced by 49.57 g (0.25 moles) of 4,4'-diaminodiphenyl methane, and the resultant aromatic imide polymer exhibited a logarithmic viscosity of 1.67.

The resultant flexible laminate had the following properties.

| | |
|---|---|
| Surface resistivity: | $1.9 \times 10^{17} \Omega$ |
| Peeling strength: | 1.00 kg/cm |
| Solvent resistance: | No change |
| Flex-cracking resistance: | 51 times |
| Alkali resistance: | 46 times |
| Soldering resistance: | No change |
| Warpage: | 6.14 cm |

EXAMPLE 5

The same procedures as those described in Example 3 were carried out except that 4,4'-diaminodiphenyl ether was replaced by 49.57 g (0.25 moles) of 4,4'-diaminodiphenyl thioether, and the resultant aromatic imide polymer exhibited a logarithmic viscosity of 1.34.

The resultant flexible laminate exhibited the following properties.

| | |
|---|---|
| Surface resistivity: | $8.7 \times 10^{16} \Omega$ |
| Peeling strength: | 1.21 kg/cm |
| Solvent resistance: | No change |
| Flex-cracking resistance: | 46 times |
| Alkali resistance: | 39 times |
| Soldering resistance: | No change |
| Warpage: | 5.83 cm |

COMPARATIVE EXAMPLE 1

The same procedures as those described in Example 3 were carried out except that 4,4'-diaminodiphenyl ether was replaced by 56.58 g (0.25 moles) of 3,3'-dimethyl-4,4'-diaminodiphenyl thioether, and the resultant aromatic imide polymer exhibited a logarithmic viscosity of 0.75.

The resultant comparative laminate exhibited a poor flex-cracking resistance of 26 times.

COMPARATIVE OF EXAMPLE 2

The same procedures as those described in Example 3 were carried out except that 4,4'-diaminodiphenyl ether was replaced by a mixture of 24.7 g (0.125 moles) of 4,4'-diaminodiphenyl methane and 15.27 g (0.125 moles) of 2,4-diaminotoluene, and the resultant aromatic imide polymer exhibited a logarithmic viscosity of 0.65.

The resultant laminate exhibited a poor flex-cracking resistance of 17 times.

COMPARATIVE OF EXAMPLE 3

The same polyamic acid solution-preparation procedures as those described in Example 1 were carried out except that the reaction mixture contained 10% weight of water, almost all of the water was removed by means of evaporation after the reaction was completed, and the resultant polyamic acid had a logarithmic viscosity of 0.78.

The solution was spread on a surface of a copper foil having a thickness of 35 microns to form a solution layer having a thickness of 320 microns. The solution layer was dried at a temperature of 120° C. for 2 hours and, then, at a temperature of 300° C. for 30 minutes so as to completely remove the solvent and to imidize the polyamic acid. A laminate composed of the copper foil firmly bonded with an aromatic imide polymer solid layer having a thickness of approximately 25 microns was thus obtained.

This laminate exhibited a satisfactory flex-cracking resistance of 56 times. However, when the laminate was subjected to the warpage test, the laminate was remarkably curled to an extent that the curvature radius of the curled laminate was 1.73 cm.

COMPARATIVE OF EXAMPLE 4

The same procedures as those described in Comparative Example 3 were carried out except that 3,3',4,4'-biphenyl tetracarboxylic dianhydride was replaced by 54.53 g (0.25 moles) of pyromellitic dianhydride, and the resultant polyamic acid had a logarithmic viscosity of 0.96.

The resultant laminate exhibited an excellent flex-cracking resistance of 66 times. However, after the laminate was subjected to the alkali treatment, the treated laminate exhibited a greatly decreased flex-cracking resistance of 13 times. Also, when the laminate was subjected to the warpage test, the laminate was remarkably curled to an extent that the curling curvature radius was 1.80 cm.

We claim:

1. A process for producing an aromatic imide polymer laminate material, comprising coating a surface of a metallic foil with a solution of at least one aromatic imide polymer comprising at least 90 molar% of at least one type of recurring unit of the formula (I):

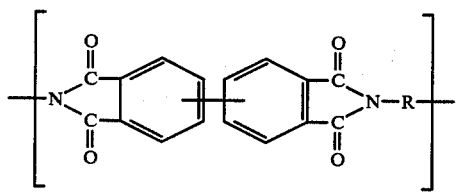

wherein R represents a symmetrical bivalent aromatic radical having no substituent, and dissolved in a solvent consisting essentially of at least one phenolic compound; and heat evaporating said solvent from said aromatic imide polymer solution layer to form an aromatic imide polymer solid layer firmly bonded directly to said metallic foil.

2. The process as claimed in claim 1, wherein said symmetrical bivalent aromatic radical represented by R in formula (I) is of the symmetrical formula (II):

wherein X represents a radical selected from the group consisting of —O—, —CH$_2$—, —C(CH$_3$)$_2$—, —S—, —CO—, —SO$_2$— and —SO—.

3. The process as claimed in claim 1, wherein said aromatic imide polymer is a polymerization-imidization product with at least one biphenyl tetracarboxylic acid compound selected from the group consisting of 3,3',4,4'-biphenyl tetracarboxylic acid, 2,3,3',4'-biphenyl tetracarboxylic acid, and their dianhydrides with at least one symmetrical aromatic primary diamine having no substituent.

4. The process as claimed in claim 3, wherein said symmetrical aromatic primary diamine is of formula (IIa):

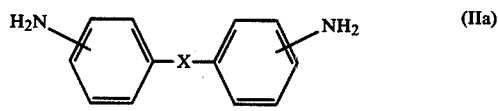

wherein X represents a radical selected from the group consisting of —O—, —CH$_2$—, —C(CH$_3$)$_2$—, —S—, —CO—, —SO$_2$— and —SO—, and the —NH$_2$ radicals are positioned symmetrically to each other about the radical X.

5. The process as claimed in claim 3, wherein said symmetrical aromatic primary diamine is selected from the group consisting of 4,4'-diaminodiphenylether, 4,4'-diaminodiphenylthioether, 4,4'-diaminobenzophenone, 4,4'-diaminodiphenylmethane, 4,4'-diaminodiphenylsulfone, and 2,2'-bis(4-aminophenyl)propane.

6. The process as claimed in claim 1, wherein said phenolic compound is selected from the group consisting of phenol, cresol, nitrophenols, and halogenated phenols.

7. The process as claimed in claim 1, wherein said aromatic imide polymer is in a concentration of 5% to 30% by weight.

8. The process as claimed in claim 1, wherein said aromatic imide polymer has a degree of imidization of 95% or more and a logarithmic viscosity of from 0.7 to 6 determined in a concentration of 0.5 g per 100 ml of 4-chlorophenol at a temperature of 50° C.

9. The process as claimed in claim 1, wherein said metallic foil consist essentially of at least one electroconductive metal selected from copper, tungsten, nickel, chromium, iron, silver, aluminum, lead, tin, and alloys comprising one or more of the above-mentioned metals.

10. The process as claimed in claim 1, wherein said metallic foil has a thickness of 10 to 100 microns.

11. The process as claimed in claim 1, wherein said surface of said metallic foil is a roughened surface.

12. The process as claimed in claim 1, wherein said aromatic imide polymer solution layer has a thickness of from 50 to 1000 microns.

13. The process as claimed in claim 1, wherein said heat evaporation procedure is carried out by gradually elevating the temperature of the ambient atmosphere of said aromatic imide polymer solution layer from the ambient temperature to from 250° C. to 400° C.

14. The process as claimed in claim 1, wherein the resultant aromatic imide polymer solid layer has a thickness of from 10 to 150 microns.

* * * * *